United States Patent
Paull

(10) Patent No.: US 7,551,011 B2
(45) Date of Patent: Jun. 23, 2009

(54) CONSTANT PHASE ANGLE CONTROL FOR FREQUENCY AGILE POWER SWITCHING SYSTEMS

(75) Inventor: Ian Alan Paull, Henrietta, NY (US)

(73) Assignee: Ameritherm, Inc., Scottsville, NY (US)

( * ) Notice: Subject to any disclaimer, the term of this patent is extended or adjusted under 35 U.S.C. 154(b) by 136 days.

(21) Appl. No.: 11/834,284

(22) Filed: Aug. 6, 2007

(65) Prior Publication Data

US 2008/0036504 A1    Feb. 14, 2008

Related U.S. Application Data

(60) Provisional application No. 60/836,689, filed on Aug. 10, 2006.

(51) Int. Cl.
*H03L 7/06* (2006.01)

(52) U.S. Cl. ...................................... 327/156; 327/147

(58) Field of Classification Search .................. None
See application file for complete search history.

(56) References Cited

U.S. PATENT DOCUMENTS 6,144,139 A * 11/2000 Noma et al. ........... 310/316.01
7,102,447 B2 * 9/2006 Mattisson et al. ............ 331/16

* cited by examiner

*Primary Examiner*—Tuan T Lam
(74) *Attorney, Agent, or Firm*—Rothwell, Figg, Ernst & Manbeck, P.C.

(57) ABSTRACT

Power switching systems often benefit from controlling the instant at which the power devices change state so as to minimize dissipation in these devices. Such systems often require fairly tight tolerances on reactive components and a relatively narrow frequency operating range to be certain these switching times occur as intended. This invention defines a system that can adapt the required switching instant over very wide changes in the reactive components.

20 Claims, 1 Drawing Sheet

CONSTANT PHASE ANGLE CONTROL FOR FREQUENCY AGILE POWER SWITCHING SYSTEMS

This application claims the benefit of U.S. Provisional Patent Application No. 60/836,689, filed on Aug. 10, 2006, which is incorporated herein by this reference.

BACKGROUND

Linear power control systems generally have power control devices (e.g., transistors) that simultaneously have voltage across them and current through them. This condition causes poor efficiency and great dissipation in the devices. Switching power control systems avoid simultaneous voltage and current by reducing the time during which this condition occurs, by switching when voltage or current is at a reduced level, or some combination of these methods. Those situations in which switching is timed to occur with reduced voltage or current generally do so by selecting an operating frequency such that the reactive components designed in the circuit will cause the reduction at a known time, when switching takes place. The resulting high efficiency can be degraded by variations in frequency or component values, due to temperature, aging, unit to unit variations or other causes.

SUMMARY

The present invention aims to overcome the above and/or other disadvantages of prior art systems.

In one aspect, the present invention provides a system for maintaining a desired phase difference between a voltage and a current produced by a voltage controlled oscillator so that power device switching may occur at an efficient time. The system holds constant the phase angle (i.e., the difference in phase between the voltage and the current) even though drift may occur in the voltage controlled oscillator and resonant components coupled thereto. Circuits according to the present invention may be used in an induction heating system that may include a customer selected induction coil and/or capacitor, and may be configured to track variations in resonant frequency so that the induction heating system may operate efficiently even as the resonant circuit accepts customer selected coils and capacitors, and as the resonance and loading change rapidly due to process interaction. There are similar applications to switching power supplies with rectified DC output(s).

In some embodiments, a system according to an aspect of the present invention may include: a voltage controlled oscillator configured to generate an output; a current transformer receiving the output of the voltage controlled oscillator; a phase detector having a first input and a second input and being configured to receive at the first input a signal from the current transformer and to receive at the second input the output from the voltage controlled oscillator (which may first pass through a time delay circuit); an adjustable or fixed voltage source configured to produce a preset output voltage; and a differential amplifier having (i) a first input configured to receive an output from the phase detector and (ii) a second input configured to receive the output voltage from the adjustable or fixed voltage source, wherein the differential amplifier is configured to output a voltage that corresponds to the difference between the output of the phase detector and the output of the voltage source, wherein the output of the differential amplifier is coupled by way of a loop filter to an input of the voltage controlled oscillator.

In one aspect, the present invention provides a method for maintaining a desired phase difference between a voltage and a current produced by a voltage controlled oscillator. In some embodiments, the method includes the steps of: using the voltage controlled oscillator to generate a first signal; providing the first signal to a current transformer, wherein the current transformer produces a second signal; receiving at a first input of a phase detector the signal output from the current transformer; receiving at a second input of the phase detector the signal output from the voltage controlled oscillator, having optionally passed through a time delay circuit; using a voltage source to produce a desired output; producing a voltage that corresponds to the difference between an output of the phase detector and the output of the voltage source; and providing said produced voltage to an integrator and/or loop filter and then to an input of the voltage controlled oscillator.

The above and other embodiments of the present invention are described below with reference to the accompanying drawings.

BRIEF DESCRIPTION OF THE DRAWINGS

The accompanying drawings, which are incorporated herein and form part of the specification, illustrate various embodiments of the present invention. In the drawings, like reference numbers indicate identical or functionally similar elements.

DETAILED DESCRIPTION OF PREFERRED EMBODIMENTS

As used herein, the words "a" and "an" mean "one or more."

Figure 1:
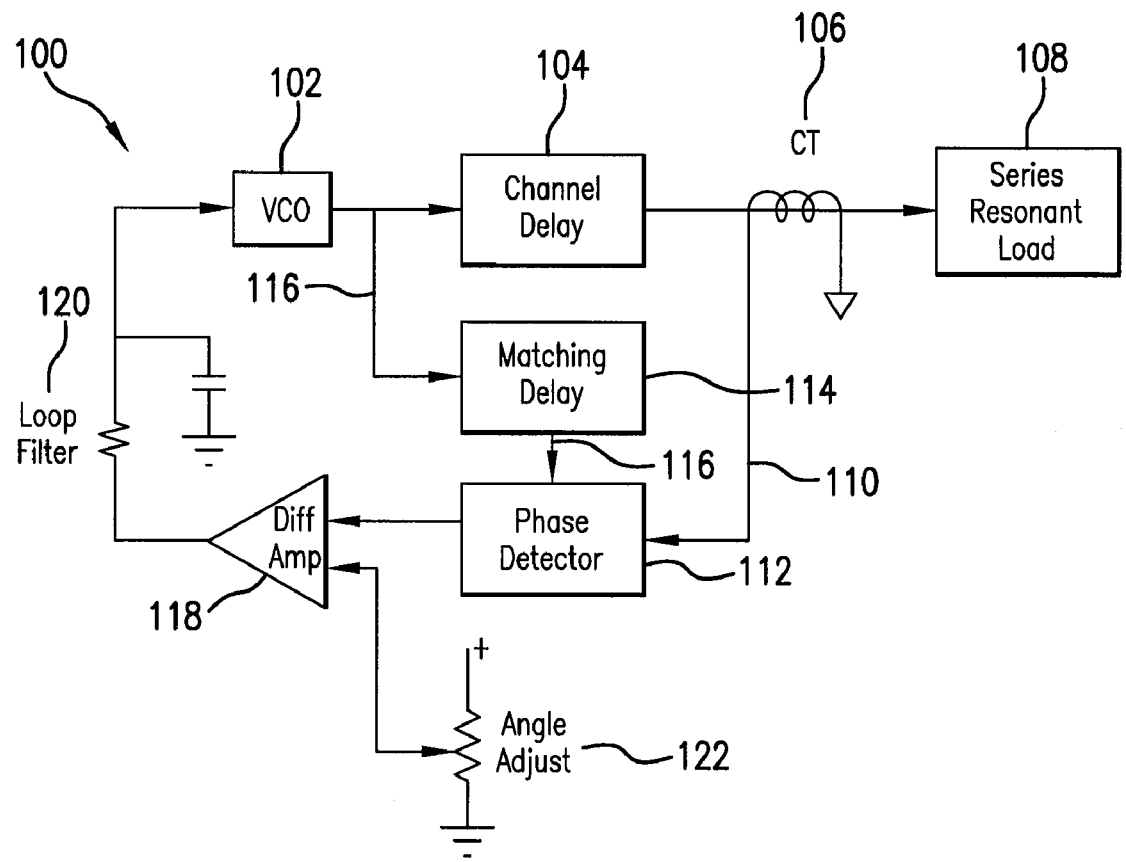
FIG. 1 illustrates a system according to some embodiments of the invention.

A system 100 according to one embodiment of the present is illustrated FIG. 1. Referring now to FIG. 1, a voltage controlled oscillator (VCO) 102 generates a repeating source of square waves that travels though circuitry 104 that may include drivers, level shifters, isolation devices and power switches (all represented here within the box labeled "Channel Delay"). The power (e.g., current) output by VCO 102 travels through a current transformer (CT) 106 to a series resonant load 108. The series resonant load may be modeled as a capacitor in series with an inductor and in series with a resistor. In actual systems, the resistor represents an energy sink such as an inductively heated work piece in the coil or load circuitry in the more general case. There may be transformer matching and other components as part of the series resonant load.

As illustrated in FIG. 1, a signal 110 from the CT 106 connects to an input of a phase detector 112, which may be a digital phase detector. A second input of the phase detector 112 is fed from the VCO 102 after being delayed by a matching delay circuit 114, which compensates for the delays in the channel delay circuit 104. The CT 106 output 110 may be configured with polarity such that, at resonance, the phase detector 112 would see 180 degrees phase difference between the signal 110 it receives from CT 106 and the signal 116 output from VCO 102. Other configurations are contemplated.

Figure 2:
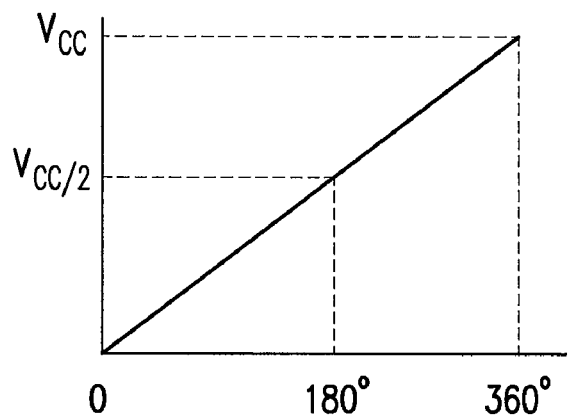
FIG. 2 is a graph illustrating the output response of a phase detector.

The phase detector 112 may be of the type with a voltage output as shown on the graph of FIG. 2, with 0 volts at 0 degree phase difference, Vcc volts at 360 degree phase difference, and a linear slope between those points. The output of phase detector 112 is shown going into an input of a differential amplifier 118 and then a loop filter 120, although these two components may be interchanged and embellished. The loop filter may be a passive or active circuit, and may include an integrator. The output of an voltage source 112 is provided to the second input amplifier 118. Voltage source 112 may be a fixed or adjustable voltage source.

The output from the differential amplifier 118 is fed into a control input of the VCO 102, thereby forming a closed loop control system. A difference between the phase detector 112 output voltage and the voltage output by voltage source 122 will cause amplifier 118 to generate an error voltage, which, as described above, is provided to the control input of VCO 112. When the control input of VCO 112 receives the error voltage, the frequency of the signal output by VCO 112 is changed so as to minimize the error voltage.

Whatever voltage the voltage source 112 is set to output, the action of the above described closed loop will be to force the frequency to change and make the phase detector have that same output voltage. If the phase detector sees 180 degrees phase difference between the two inputs at resonance and the voltage source 122 is set to Vcc/2, then the system will operate at resonance, otherwise the system will operate off resonance with a controlled angle, that is determined by the output of the voltage source 122 (offset operation may be desired, for example, for best efficiency if there are other timing demands such as dead time (not shown)). Accordingly, voltage source 122 may be referred to as the "angle adjuster" or "phase angle adjuster." This voltage source may be dynamically set rather than fixed during operation to meet other system constraints.

While various embodiments/variations of the present invention have been described above, it should be understood that they have been presented by way of example only, and not limitation. Thus, the breadth and scope of the present invention should not be limited by any of the above-described exemplary embodiments.

What is claimed is:

1. A system, comprising:
   a voltage controlled oscillator configured to generate an output;
   a current transformer configured to receive the output of the voltage controlled oscillator;
   a phase detector having a first input and a second input and being configured to receive at the first input a signal from the current transformer and to receive at the second input the output from the voltage controlled oscillator;
   a voltage source configured to produce a desired output voltage; and
   a differential amplifier having (i) a first input configured to receive an output from the phase detector and (ii) a second input configured to receive the output voltage from the voltage source, wherein
   the differential amplifier is configured to output a voltage that corresponds to the difference between the output of the phase detector and the output of the voltage source, and
   the output of the differential amplifier is provided to an input of the voltage controlled oscillator.

2. The system of claim 1, further comprising a delay circuit connected between an output of the voltage controlled oscillator the second input of the phase detector, and wherein the voltage source is an adjustable voltage source.

3. The system of claim 1, wherein the phase detector is a digital phase detector.

4. The system of claim 1, further comprising a loop filter connected between the output of the differential amplifier and the input of the voltage controlled oscillator.

5. The system of claim 4, wherein the loop filter consists of a resistor and a capacitor.

6. The system of claim 1, further comprising a loop filter connected between the output of the phase detector and the first input of the differential amplifier.

7. The system of claim 1, wherein the signal from the current transformer is a current signal.

8. The system of claim 7, wherein the output from the voltage controlled oscillator is a voltage signal.

9. The system of claim 8, wherein the output from the phase detector is a voltage and the voltage corresponds to the difference in phase between the voltage signal and the current signal.

10. The system of claim 9, wherein the voltage controlled oscillator is configured to modify the frequency of the voltage signal upon receiving an error signal from the differential amplifier.

11. The system of claim 1, wherein said output is delayed in time to match the delay which may be present between the voltage controlled oscillator and the current transformer.

12. A method, comprising:
    using a voltage controlled oscillator to generate a first signal;
    providing the first signal to a current transformer, wherein the current transformer produces a second signal;
    receiving at a first input of a phase detector the signal output from the current transformer;
    receiving at a second input of the phase detector the signal output from the voltage controlled oscillator;
    using an voltage source to produce a desired output;
    producing a voltage that corresponds to the difference between an output of the phase detector and the output of the voltage source; and
    providing said produced voltage to an input of the voltage controlled oscillator.

13. The method of claim 12, wherein the phase detector is a digital phase detector.

14. The method of claim 12, further comprising filtering said produced voltage prior to providing said voltage to the input of the voltage controlled oscillator.

15. The method of claim 14, wherein the filtering step comprises using a loop filter that comprises a resistor and a capacitor.

16. The method of claim 12, wherein the second signal is a current signal.

17. The method of claim 16, wherein the first signal is a voltage signal.

18. The method of claim 17, wherein the output of the phase detector is a voltage and the voltage corresponds to the difference in phase between the voltage signal and the current signal.

19. The method of claim 18, further comprising modifying the frequency of the voltage signal based upon said voltage that corresponds to the difference between an output of the phase detector and the output of the voltage source, wherein the voltage source is an adjustable voltage source.

20. The method of claim 12, further comprising delaying the first signal in time to match a delay that may be present between the voltage controlled oscillator and the current transformer prior to providing the first signal to the phase detector.

* * * * *